United States Patent
Haapoja

(10) Patent No.: US 7,171,235 B2
(45) Date of Patent: Jan. 30, 2007

(54) ARRANGEMENT AND METHOD FOR REDUCING LOSSES IN RADIO TRANSMITTER

(75) Inventor: Sami Haapoja, Helsinki (FI)

(73) Assignee: Nokia Corporation, Espoo (FI)

( * ) Notice: Subject to any disclaimer, the term of this patent is extended or adjusted under 35 U.S.C. 154(b) by 310 days.

(21) Appl. No.: 10/027,089

(22) Filed: Dec. 20, 2001

(65) Prior Publication Data

US 2002/0086650 A1 Jul. 4, 2002

(30) Foreign Application Priority Data

Dec. 29, 2000 (FI) .................................. 20002881

(51) Int. Cl.
*H04M 1/00* (2006.01)

(52) U.S. Cl. ............................... 455/553.1; 455/277.1; 455/134; 455/135; 455/22; 333/101

(58) Field of Classification Search .................. 455/73, 455/78, 79, 82–84, 550.1, 552.1, 553.1, 132, 455/133, 134, 135; 333/100, 101, 105

See application file for complete search history.

(56) References Cited

U.S. PATENT DOCUMENTS

| 4,422,047 | A | * | 12/1983 | Wright | 330/51 |
| 4,980,660 | A | * | 12/1990 | Nakamura et al. | 333/101 |
| 5,276,914 | A | * | 1/1994 | Ishizuka et al. | 455/83 |
| 5,715,525 | A | * | 2/1998 | Tarusawa et al. | 455/101 |
| 5,896,562 | A | * | 4/1999 | Heinonen | 455/76 |
| 6,014,551 | A | * | 1/2000 | Pesola et al. | 455/86 |
| 6,023,609 | A | | 2/2000 | Futamura | 455/82 |
| 6,023,611 | A | | 2/2000 | Bolin et al. | 455/114 |
| 6,212,172 | B1 | * | 4/2001 | Barabash et al. | 370/277 |
| 6,400,963 | B1 | * | 6/2002 | Glockler et al. | 455/553.1 |
| 6,442,375 | B1 | * | 8/2002 | Parmentier | 455/78 |
| 6,628,942 | B1 | * | 9/2003 | Beming et al. | 455/458 |
| 6,662,028 | B1 | * | 12/2003 | Hayes et al. | 455/575.7 |
| 6,721,543 | B1 | * | 4/2004 | Katsura et al. | 455/73 |
| 6,724,278 | B1 | * | 4/2004 | Smith | 333/133 |

FOREIGN PATENT DOCUMENTS

| DE | 19514717 A1 | 10/1996 |
| EP | 0 481 825 A2 | 4/1992 |
| EP | 0665643 A3 | 8/1995 |
| GB | 2 346 049 A | 7/2000 |

* cited by examiner

*Primary Examiner*—Edward F. Urban
*Assistant Examiner*—Nhan T. Le
(74) *Attorney, Agent, or Firm*—Perman & Green, LLP

(57) ABSTRACT

The invention relates to an arrangement and method for reducing losses at the transmitting end of a radio apparatus, especially one that operates in more than one system. An interfering transmitter is provided with two antenna filters one of which is a low-pass-type filter and the other a band-pass filter. The filter (BPF) with a higher stop-band attenuation is used only when the receiver (330, LNA) susceptible to interference is in receive state. At other times, the filter (LPF) with a lower stop-band attenuation and, hence, a lower pass-band attenuation, is used as the transmitting-end filter. Advantageously the selection between the different filters is realized using MEMS-type switches (SW31 to SW34). The invention minimizes the mean current consumption of the radio-frequency power amplifier (PA) of the said radio apparatus. The space required by and the production costs of the arrangement according to the invention are relatively small.

14 Claims, 4 Drawing Sheets

ARRANGEMENT AND METHOD FOR REDUCING LOSSES IN RADIO TRANSMITTER

The invention relates to an arrangement for reducing losses at the transmitting end of a radio apparatus, especially one that operates in multiple systems. The invention also relates to a method for reducing losses at the transmitting end of a radio apparatus operating in multiple systems.

Radio apparatuses generally need filters in order to attenuate undesired frequency components and noise. One such point is after the power amplifier of a transmitter, before the antenna. A transmitting-end filter placed there prevents frequency components outside the transmitting band of the signal to be transferred from radiating into the environment and, furthermore, in the case of a bidirectional apparatus in which transmitting and reception take place in different bands, the transmitting is prevented from interfering with the reception. On the other hand, a filter on the transmission path also causes some attenuation in the signal to be transferred the spectrum of which is in the pass band of the filter. All attenuation prior to the transmitting antenna is especially harmful since increased losses between the power amplifier and antenna will result in increased current consumption in the power amplifier as well as potential heating problems.

Figure 1:
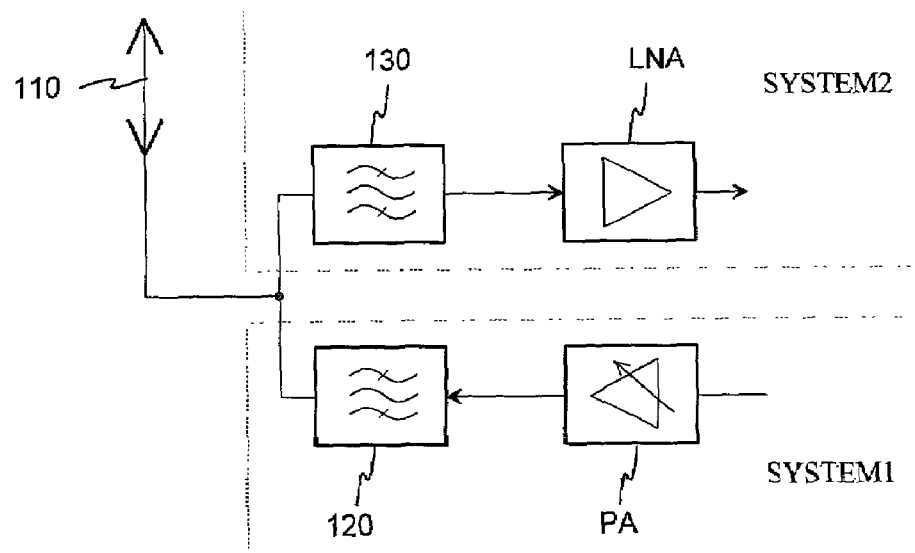

In GSM (Global System for Mobile communications) phones, for example, the transmitting-end filter may be a relatively simple low-pass filter where the pass-band attenuation can be brought relatively low, say, down to 0.5 dB. The situation may become problematic if the apparatus is meant to operate simultaneously in multiple systems the operating bands of which are near each other. FIG. 1 depicts such a case. There is seen a radio-frequency power amplifier PA and transmitting-end filter 120 belonging to a transmitter in one system, and a receiving-end filter 130 and low-noise amplifier LNA belonging to a receiver in a second system. The systems share an antenna 110. The second system may be e.g. the GPS (Global Positioning System) the reception frequency of which is 1575.42 MHz. If, for example, a positioning feature based on the GPS is to be provided in a GSM1800 mobile phone, the GPS reception will be susceptible to interference caused by GSM transmissions. In that case the GSM transmitting end requires something more than a low-pass filter or a band-pass filter the stop-band attenuation of which increases slowly when moving downward from the operating band. The filter must be a band-pass filter the attenuation of which increases sharply below the bass band. The GPS reception frequency and GSM transmitting band are only 125 MHz apart, and GPS reception has got strict requirements regarding interference. In FIG. 1, the antenna filter 120 in the first system is a "true" band-pass filter described above. As such, it is not difficult to produce a band-pass filter with good enough stop-band attenuation characteristics. The drawback is that the pass-band attenuation of the band-pass filter required is inevitably higher than that of the low-pass-type filter replaced by it. The increase in the attenuation is typically in the order of 2 dB. An increase of 0.1 dB in the pass-band attenuation of a transmitting-end filter causes in practice an increase of at least two percent in the current consumption of the power amplifier. Interference-free GPS reception thus means an increase of several tens of percent in the current consumption of the GSM transmitter. This, in turn, means that the thermal design of the apparatus becomes more demanding and, on the other hand, the charging interval of the battery of the phone becomes shorter.

The problem described above may also come about if a mobile station is provided with e.g. Bluetooth or WLAN (Wireless Local Area Network) technology in addition to its basic technology and especially if transmission and reception in the same system occasionally take place simultaneously in the device. Such a situation may arise e.g. in a phone built to support the GPRS (General Packet Radio System) class that requires simultaneous transmitting and reception. In that case a filter is needed after the power amplifier where the attenuation of the filter on the reception band is e.g. 50 dB higher than what is needed in normal speech mode. However, the filter must be designed in accordance with the worst case which means that most of the time the filter structure is unnecessarily heavy and causes unnecessary pass-band attenuation.

Furthermore, a similar situation may arise if apparatuses according to, say, GSM and WCDMA (Wideband Code Division Multiple Access) systems which share a power amplifier operate in the same frequency band but not simultaneously. In the WCDMA system, transmitting and reception take place simultaneously which has to be taken into account when specifying the filter that follows the power amplifier. The noise level caused by the transmitter on the reception band in the WCDMA state must be more than 50 dB lower than in the GSM state.

Figure 2:
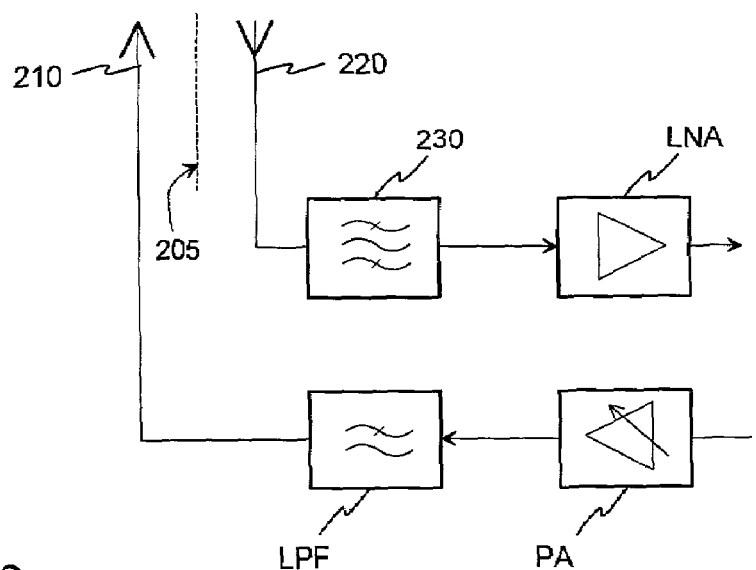

The problem described above can be alleviated by making a separate antenna for the receiver suffering from interference from the transmitter and by arranging for sufficient isolation between the transmitting and receiving antennas. Such a solution is shown in FIG. 2. There are, connected in series, a radio-frequency power amplifier PA, low-pass-type receiving-end filter LPF, and a transmitting antenna 210 as well as a separate receiving antenna 220 connected to a receiving-end antenna filter 230 which, in turn, is connected to a low-noise amplifier LNA. The term "low-pass-type filter" covers in this description and in the claims both true low-pass filters and band-pass filters in which the stop-band attenuation increases relatively slowly when moving downward from the pass band. FIG. 2 further shows a broken line 205 between the antennas, referring to an arrangement which provides for electromagnetic isolation between the transmitting and receiving antennas. A disadvantage of this solution is that it requires additional hardware and space and furthermore increases the production costs. Moreover, the antenna isolation which is achieved does not necessarily alone suffice to attenuate the interferences.

An object of the invention is to reduce the said disadvantages associated with the prior art. The structure according to the invention is characterized by that which is specified in the independent claim 1. The method according to the invention is characterized by that which is specified in the independent claim 13. Advantageous embodiments of the invention are specified in the other claims.

The basic idea of the invention is as follows: The interfering transmitter is provided with two antenna filters one of which is of the low-pass type, for example, and the other a band-pass filter. The filter with a higher stop-band attenuation is used only when the receiver susceptible to interference is in receive state. At other times, the filter with a lower stop-band attenuation and, hence, a lower pass-band attenuation, is used as a transmitting-end filter. Advantageously the selection between the different filters is realized using MEMS (Microelectro-Mechanical System) type switches.

An advantage of the invention is that it minimizes the mean current consumption of a radio-frequency power amplifier in a radio apparatus operating in multiple systems. This is because the transmitting-end filter required by the receiver susceptible to interference is used only for a relatively short period of time and, on the other hand, because the MEMS switches, which are placed in the signal transmission path in order to realize switching between transmitting-end filters, have got very low transfer resistances and require very little control power. Another advantage of the invention is that the switch arrangement according to the invention does not cause spurious radiation, which may be caused by semiconductor switches because of their nonlinearity. A further advantage of the invention is that the space required by and the production costs of the arrangement according to the invention are relatively small.

Figure 4:
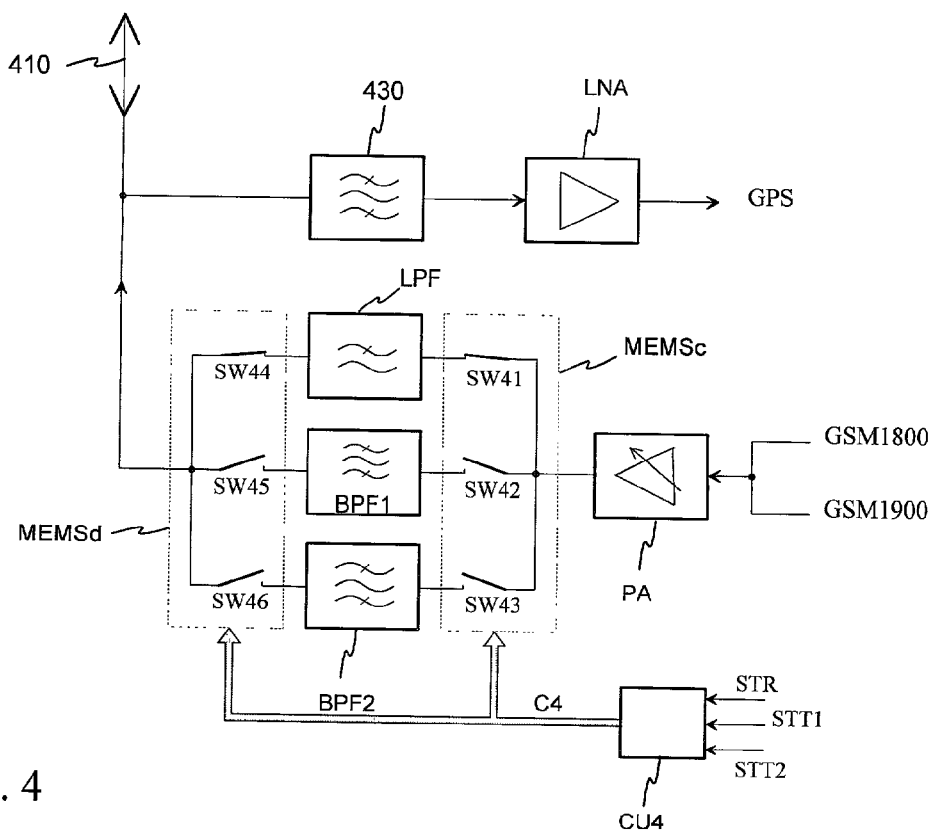
Figure 5:
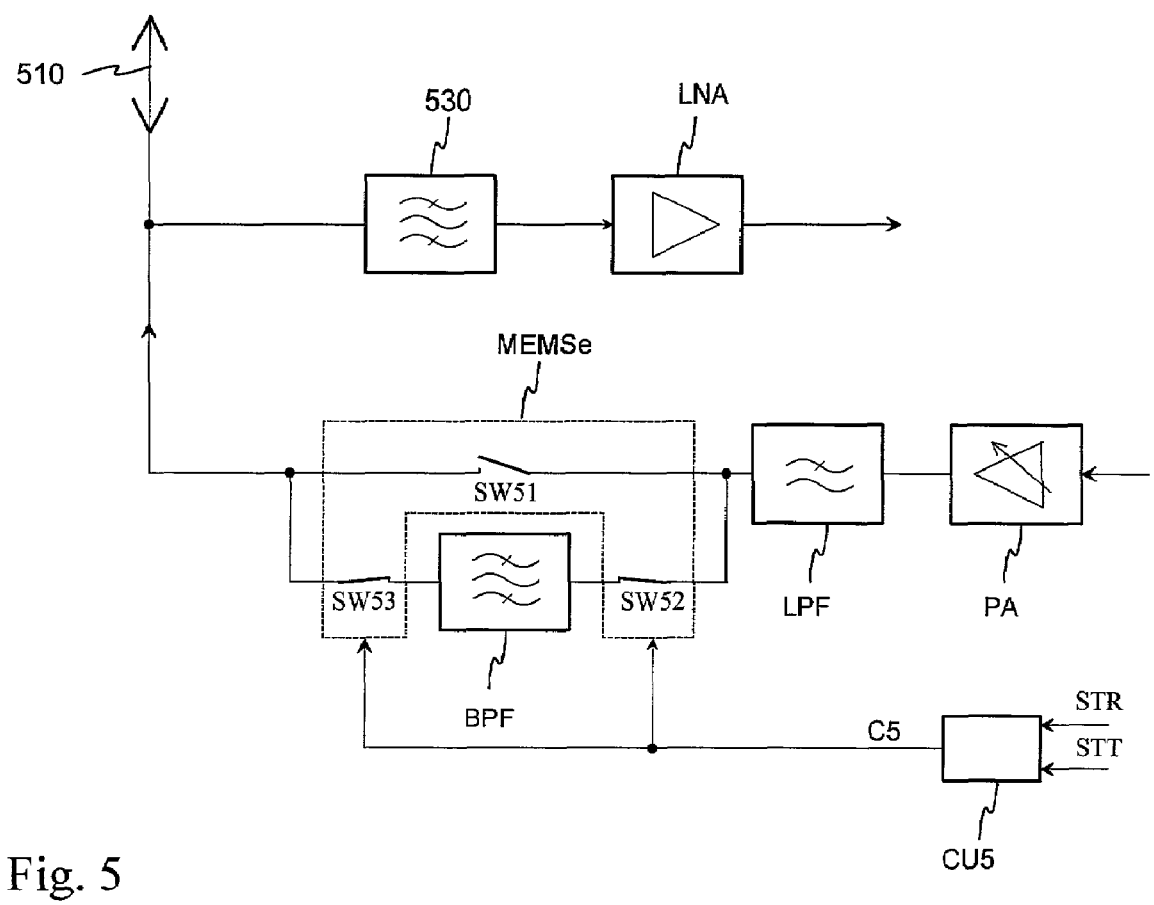
Figure 6:
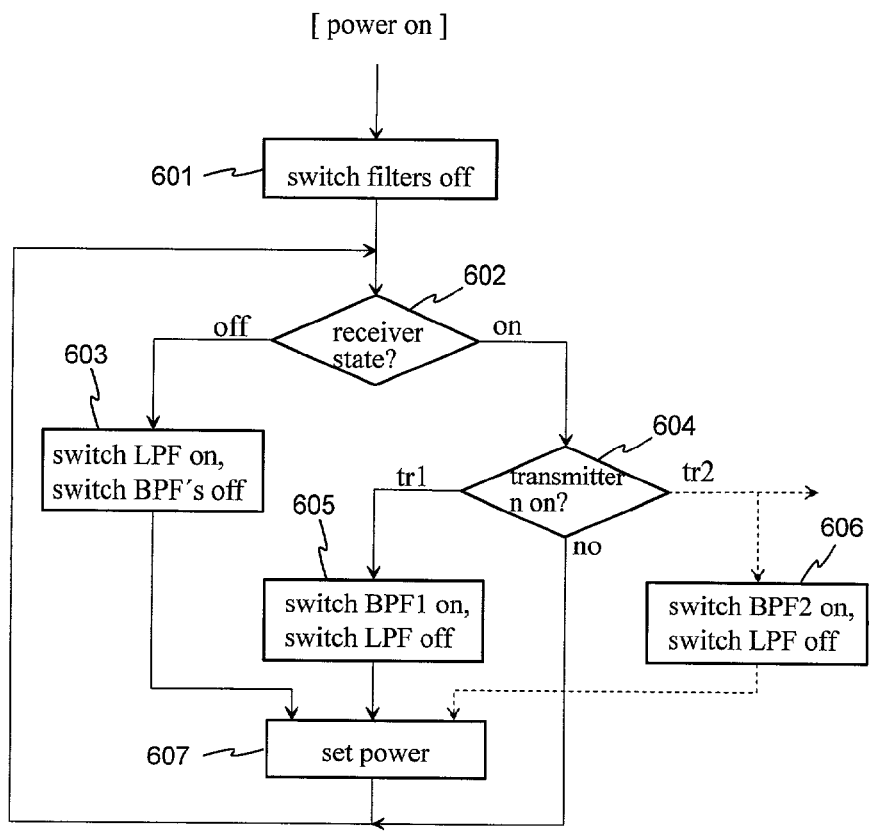
Figure 7:
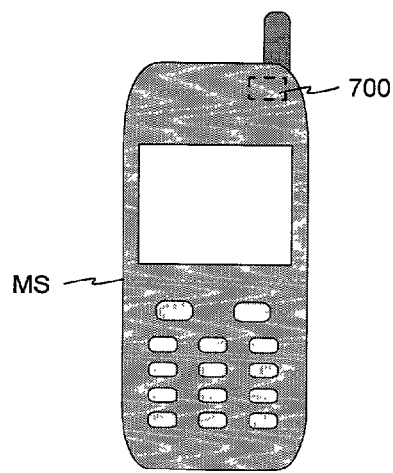

The invention is described in detail in the following. Reference is made to the accompanying drawings in which FIG. 1 shows an arrangement according to the prior art for shielding reception, FIG. 2 shows an arrangement according to the prior art for reducing losses at the transmitting end, FIG. 3 shows an example of an arrangement according to the invention for reducing losses at the transmitting end, FIG. 4 shows a second example of an arrangement according to the invention for reducing losses at the transmitting end, FIG. 5 shows a third example of an arrangement according to the invention for reducing losses at the transmitting end, FIG. 6 shows a method according to the invention for reducing losses at the transmitting end, and FIG. 7 shows an example of a mobile station provided with an arrangement according to the invention.

FIGS. 1 and 2 were already discussed in connection with the description of the prior art.

Figure 3:
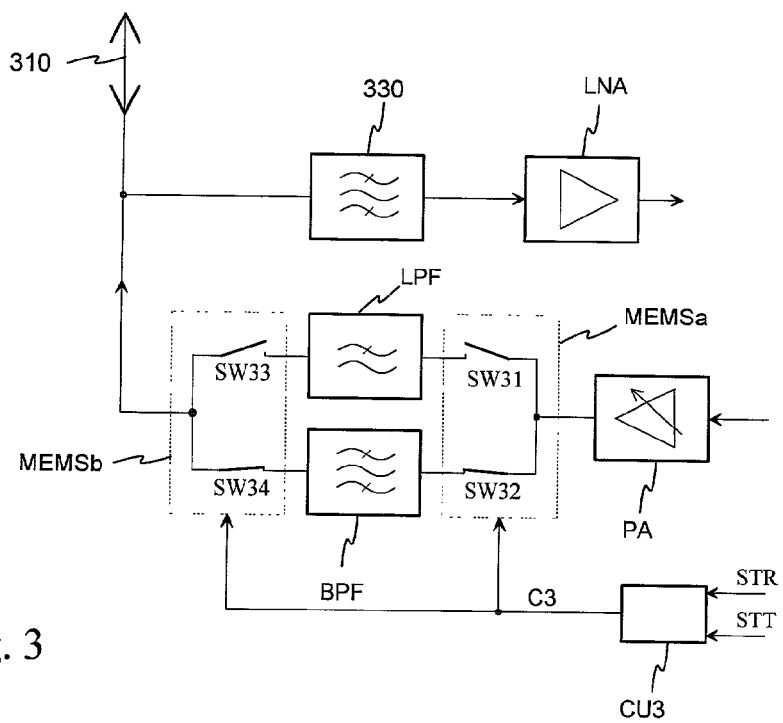

FIG. 3 shows in the form of block diagram an example of a structure according to the invention. It shows, like FIG. 1, a radio-frequency power amplifier PA belonging to a transmitter in a first system, a receiving-end filter 330 and low-noise amplifier LNA belonging to a receiver, and a common antenna 310. The receiver may belong to another or the same system as the transmitter. Replacing the transmitting-end filter shown in FIG. 1, there are now two parallel antenna filters; a low-pass-type filter LPF and a band-pass filter BPF. In this description and in the claims a "transmitting-end filter" means a filter in the signal path between the power amplifier and antenna, and "antenna filter" means a filter which can be connected as a transmitting-end filter or part of a transmitting-end filter. In addition, FIG. 3 shows switch units MEMSa and MEMSb which both are simple selectors; the former has got one input and two outputs, and the latter has got two inputs and one output. The output of the power amplifier PA is connected to the input of selector MEMSa. This selector includes two make switches SW31 and SW32. The input of the selector leads to the first output via switch SW31 and to the second output via switch SW32. The first output is connected to the input of the low-pass-type filter and the second out-put to the input of the band-pass filter. The output of the low-pass-type filter is connected to the first input of the second selector MEMSb and the output of the band-pass filter to the second input of the second selector. The second selector includes two make switches SW33 and SW34. The first input of the selector leads to the common output via switch SW33 and the second input via switch SW34. The output of the selector MEMSb is connected to the antenna. The selectors are controlled so that either the switches SW31 and SW33 are closed and switches SW32 and SW34 open or switches SW32 and SW34 are closed and switches SW31 and SW33 are open. In the former case it is the low-pass-type filter LPF that is connected between the power amplifier and antenna, and in the latter case, depicted in FIG. 3, it is the band-pass filter BPF. The band-pass filter is used only when the said receiver is in receive state. The switch control signal C3 contains status information for the receiver and it comes from the control part of the whole radio apparatus.

If the receiver in FIG. 3 belongs to the second system, the first system naturally has got a receiver of its own, which is not shown in the figure. In the case of GSM, for example, the receiver is connected to the common antenna through a conventional antenna switch.

MEMS switches are very small electromechanical elements designed for the switching of high-frequency signals. The area of an individual switch is, depending on its structure, e.g. ⅓ mm². The switches are voltage-controlled: When a high enough voltage is brought between the control electrodes, one of which is in the spring element, an electrostatic force draws the contacts of the switch together. The holding power is insignificant. Thanks to mechanical contacts, the transfer resistance of the switch is small; the attenuation caused by a MEMS switch on a high-frequency signal is typically only 0.1 dB to 0.2 dB. Insulation characteristic, i.e. isolation when the switch open, is considerably higher than in diode switches. Moreover, mechanical contacts have linearity to their advantage; the switch will not cause undesired intermodulation products like diodes do. Compared to conventional electromechanical switches, the switching times are considerably shorter, depending on the control voltage, say, 50 μs. The speed is a result of small forces of inertia which, in turn, has to do with the small size of the switch.

FIG. 4 shows in the form of block diagram a second example of a structure according to the invention. The difference from the structure of FIG. 3 is that there are now three parallel filters, a low-pass-type filter LPF, a first band-pass filter BPF1, and a second band-pass filter BPF2. Correspondingly, the selectors realized using MEMS switches are larger. The filter input side selector MEMSc has one input and three outputs, and the filter output side selector MEMSd has three inputs and one output.

The switch control signal C4, which in this case must comprise at least two bits, determines which of the said three filters is connected between the power amplifier PA and antenna 410. In FIG. 4 it is the low-pass-type filter LPF. The number of filters is due to the fact that the radio apparatus in question operates in three systems. The pass band of the band-pass filter BPF1 covers the transmitting band of the GSM1800 system, and the pass band of the band-pass filter BPF2 covers the transmitting band of the GSM1900 system. The low-pass-type filter LPF is used always when the third system GPS in the example of FIG. 4 is not in receive state or when neither of the bands 1800 and 1900 requires simultaneous transmitting and reception. The control signal C4 comes from a control unit CU4, to which is brought the receiver status information STR, status information STT1 of the GSM1800 transmitter, and the status information STT2 of the GSM1900 transmitter from the control part of the whole radio apparatus.

FIG. 5 shows a third possible implementation of the invention. It shows a radio-frequency power amplifier PA, a low-pass-type filter LPF, and a band-pass filter BPF belonging to a transmitter in a first system, and a receiving-end filter 530 and low-noise amplifier LNA belonging to a receiver, and a common antenna 510. The difference from the preceding two structures is that the filters may now be connected in series. The low-pass-type filter LPF is now connected in a fixed manner to the output of the power amplifier PA, and the band-pass filter BPF may be either shunted or connected in series with the low-pass-type filter. These connections are realized using selector MEMSe which comprises three make switches SW51, SW52 and SW53. One pole of switch SW51 is connected to the output of the low-pass-type filter and the other to the feed conductor of the antenna. One pole of switch SW52 is connected to the output of the low-pass-type filter and the other to the input of the band-pass filter. One pole of switch SW53 is connected to the output of the band-pass filter and the other to the antenna feed conductor. The selector is controlled so that either the switch SW51 is closed and switches SW52 and SW53 are open or switch SW51 is open and switches SW52 and SW53 are closed. In the former case the band-pass filter is shunted and only the low-pass-type filter is connected between the power amplifier and antenna. In the latter case, depicted in FIG. 5, the band-pass filter is connected in series with the low-pass-type filter between the power amplifier and antenna. The band-pass filter is used only when the said receiver is in receive state in which a higher stop-band attenuation is needed. The switch control signal C5 comes from a control unit CU5 to which is brought receiver status information STR and transmitter status information STT from the control part of the radio apparatus. Differently from FIG. 5, the low-pass-type filter LPF may also be located between the selector MEMSe and antenna.

The structure shown in FIG. 5 is possible because of the good isolation in the MEMS switches. To further enhance the isolation it is possible to replace switch SW51 with two MEMS switches connected in series.

FIGS. 3 to 5 show switches only for one conductor in the signal path. The other conductor is assumed to be the ground conductor, which is not shown. The output of the power amplifier may also be balanced, in which case the selectors according to the invention comprise switches for both conductors in the antenna feed line. In that case there is another, separate switch in parallel with every switch shown in FIGS. 3 to 5.

FIG. 6 shows in the form of flow diagram an example of the method according to the invention for reducing transmitting-end losses. With the supply voltage switched on in the radio apparatus, all transmitting-end antenna filters are disconnected from the rest of the circuit (step 601) in the circuit according to the invention. In step 602 the state of the receiver susceptible to interference is observed. If the receiver is in inactive state, i.e. not in receive state, the low-pass-type filter is connected as transmitting-end filter in the interfering transmitter, and the other antenna filters are disconnected from the circuit, step 603. If the receiver is in receive state, it is checked in accordance with step 604 whether any relevant transmitter is in transmit state. If a first transmitter is in transmit state, the band-pass filter BPF1 which corresponds to its transmitting band is connected as transmitting-end filter, and the other antenna filters are disconnected from the circuit, step 605. Similarly, if the apparatus comprises several relevant transmitters, the band-pass filter BPFn which corresponds to the transmitting band of the transmitter entering transmit state is connected as transmitting-end filter, and the other antenna filters are disconnected from the circuit, step 606. In step 607 the power of the radio-frequency power amplifier is adjusted to a level where the radiation power of the antenna is in accordance with the specifications of the system in which the transmitter is operating. Following the said switching operations, and also in the case that no transmitter is in transmit state, the process returns to step 602, i.e. to monitor the state of the receiver susceptible to interference.

Operation according to FIG. 6 means, among other things, that if the said receiver is not in receive state, the low-pass-type filter remains as transmitting-end filter even if the active transmitter was changed, in the case of multiple transmitters. So, a band-pass filter is selected, and in the case of multiple transmitters, the band-pass filter is changed, only if the said receiver is in receive state. This way, the losses in the power amplifier caused by the band-pass filters are minimized. Let us for example consider a case in which the interfering transmitter is a GSM1800 transmitter and the interfered receiver is a GPS receiver, and compare the solution of FIG. 1 with the solution according to the invention. If the attenuation caused by the band-pass filter is 2.5 dB, attenuation caused by the low-pass-type filter 0.5 dB, and the attenuation in the MEMS switches is 0.1 dB, the solution according to the invention brings a 30%-plus savings in the current consumption of the power amplifier when the positioning feature functions in the typical manner. In addition, thermal design becomes easier, which is desirable especially in mobile stations using GPRS.

FIG. 7 shows a mobile station MS. It comprises near the antenna feed point a circuit 700 which includes the antenna filters and switches according to the invention.

Above it was described solutions according to the invention. The invention does not limit the type of antenna used in the radio apparatus, nor the implementation of the antenna filters. The filters may be e.g. LC, resonator, or surface acoustic wave filters. The inventional idea may be applied in different ways within the limits defined by the independent claims.

The invention claimed is:

1. An arrangement for reducing transmitting end losses in a radio apparatus which comprises a receiver and at least one transmitter which, when the apparatus is being used, are occasionally simultaneously in signal transfer state, the arrangement comprising a radio-frequency power amplifier, a transmitting end filter and an antenna, wherein the transmitting end filter comprises at least two antenna filters wholly separated from said receiver, the stop-band attenuation of one of the antenna filters in the operating band of the receiver differing substantially from that of another antenna filter in the operating band of the receiver, and the arrangement further comprises switches to form the transmitting end filter of said antenna filters.

2. An arrangement according to claim 1, said switches being MEMS switches.

3. An arrangement according to claim 1, said switches being arranged to form the transmitting end filter using that one of first and second antenna filters which has a lower stop-band attenuation, when the receiver is in passive state.

4. An arrangement according to claim 1, said switches being arranged to include in the transmitting-end filter that one of first and second antenna filters which has a higher stop-band attenuation only when the receiver is in receive state.

5. An arrangement according to claim 3, the antenna filter of said antenna filters which has a lower stop-band attenuation being a low-pass-type filter and the one with a higher stop-band attenuation being a band-pass filter.

6. An arrangement according to claim 5, said transmitting end filter being the band-pass filter when the receiver is in receive state.

7. An arrangement according to claim 5, said transmitting end filter being a series connection of the low-pass-type filter and the band-pass filter when the receiver is in receive state.

8. An arrangement according to claim 1, at the transmitting end of the radio apparatus being in addition to the first and second antenna filters at least one bandpass filter, any one of which filters can be connected as the transmitting end filter by means of said switches.

9. An arrangement according to claim 1, said transmitter being one that operates at a frequency above 1.7 GHz and the receiver is a GPS receiver.

10. An arrangement according to claim 1, said transmitter and said receiver being a transmitter and a receiver in one and the same radio system.

11. An arrangement according to claim 1, said radio apparatus being arranged to operate in a first system and in a second system, which both use a same frequency band non-simultaneously, and the power amplifier is common to the transmitters conform to the both systems and the receiver is a receiver conform to the first system, the antenna end of which receiver is shared with the receiver conform to the second system.

12. An arrangement according to claim 11, the first system being WCDMA and the second system being GSM.

13. A method for reducing transmitting end losses in a radio apparatus having a receiver and at least one transmitter which, when the apparatus is being used, are occasionally simultaneously in signal transfer state, a radio-frequency power amplifier, a transmitting end filter comprising at least two antenna filters wholly separate from said receiver, and an antenna, the stop-band attenuation of one of the antenna filters in the operating band of the receiver differing substantially from that of another antenna filter in the operating band of the receiver, the method comprising:

that one of the antenna filters which has the lowest stop-band attenuation is switched as the transmitting end filter when the receiver is in passive state, that one of the antenna filters which has a higher stop-band attenuation is switched as at least part of the transmitting end filter when the receiver is in receive state, and the power of the power amplifier is adjusted after each change of transmitting end filter to keep the transmitting power within allowed limits.

14. A mobile station comprising a receiver and at least one transmitter which, when the apparatus is being used, are occasionally simultaneously in signal transfer state, a radio frequency power amplifier, a transmitting end filter, and an antenna, wherein the transmitting end filter comprises at least two antenna filters wholly separated from said receiver, the stop-band attenuation of one of the antenna filters in the operating band of the receiver differing substantially from that of another antenna filter in the operating band of the receiver, the mobile station further comprising at the transmitting end MEMS switches arranged to switch that one of said antenna filters which has the lowest stop-band attenuation as the transmitting end filter when the receiver is in passive state, and to switch that one of said antenna filters which has the higher stop-band attenuation as at least part of the transmitting end filter when the receiver is in receive state.

* * * * *